(12) United States Patent
Chou

(10) Patent No.: US 9,346,666 B2
(45) Date of Patent: May 24, 2016

(54) COMPOSITE WAFER SEMICONDUCTOR

(71) Applicant: TAIWAN SEMICONDUCTOR MANUFACTURING COMPANY, LTD., Hsinchu (TW)

(72) Inventor: Bruce C. S. Chou, Hsin Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 16 days.

(21) Appl. No.: 13/957,875

(22) Filed: Aug. 2, 2013

(65) Prior Publication Data

US 2013/0307095 A1  Nov. 21, 2013

Related U.S. Application Data

(62) Division of application No. 12/870,444, filed on Aug. 27, 2010, now Pat. No. 8,507,358.

(51) Int. Cl.

| | |
|---|---|
| G01P 15/08 | (2006.01) |
| H01L 21/70 | (2006.01) |
| H01L 23/48 | (2006.01) |
| H01L 23/52 | (2006.01) |
| H01L 29/40 | (2006.01) |
| B81B 7/00 | (2006.01) |
| B81C 1/00 | (2006.01) |

(52) U.S. Cl.
CPC ........... *B81B 7/0032* (2013.01); *B81C 1/00246* (2013.01); *B81B 2201/025* (2013.01); *B81C 2203/0109* (2013.01); *B81C 2203/0714* (2013.01)

(58) Field of Classification Search
USPC .......................................... 257/417, 777, 506
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,511,891 B2 | 1/2003 | Lin et al. |

(Continued)

FOREIGN PATENT DOCUMENTS

| | | |
|---|---|---|
| TW | 457628 B | 1/2001 |
| TW | 440979 B | 6/2001 |
| TW | 254391 B | 5/2006 |

*Primary Examiner* — Marc Armand
*Assistant Examiner* — Wilner Jean Baptiste
(74) *Attorney, Agent, or Firm* — Haynes and Boone, LLP

(57) ABSTRACT

A composite wafer semiconductor device includes a first wafer and a second wafer. The first wafer has a first side and a second side, and the second side is substantially opposite the first side. The composite wafer semiconductor device also includes an isolation set is formed on the first side of the first wafer and a free space is etched in the isolation set. The second wafer is bonded to the isolation set. A floating structure, such as an inertia sensing device, is formed in the second wafer over the free space. In an embodiment, a surface mount pad is formed on the second side of the first wafer. Then, the floating structure is electrically coupled to the surface mount pad using a through silicon via (TSV) conductor.

20 Claims, 5 Drawing Sheets

(56) References Cited

U.S. PATENT DOCUMENTS

| | | |
|---|---|---|
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,732,299 B2 | 6/2010 | Chang et al. |
| 7,821,085 B2 | 10/2010 | Suzuki et al. |
| 8,049,300 B2 | 11/2011 | Yeh et al. |
| 8,088,651 B1 | 1/2012 | Thompson et al. |
| 8,421,169 B2 | 4/2013 | Kittilsland et al. |
| 8,609,466 B2 | 12/2013 | Peng |
| 2005/0170656 A1* | 8/2005 | Nasiri ............... B81C 1/00238 438/700 |
| 2007/0287215 A1 | 12/2007 | Utsumi et al. |
| 2009/0148967 A1* | 6/2009 | Wodnicki et al. ............ 438/17 |
| 2009/0261430 A1* | 10/2009 | Suzuki et al. ............... 257/417 |
| 2010/0258950 A1* | 10/2010 | Li et al. ..................... 257/777 |
| 2011/0012247 A1* | 1/2011 | Wu .................. B81C 1/00269 257/678 |

* cited by examiner

COMPOSITE WAFER SEMICONDUCTOR

PRIORITY DATA

The present application is a divisional application of U.S. patent application Ser. No. 12/870,444, filed Aug. 27, 2010, which is incorporated herein by reference in its entirety.

BACKGROUND

The present disclosure relates generally to semiconductor manufacturing. Specifically, the present disclosure relates to a semiconductor device having a composite wafer structure and a method of fabricating the same.

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the mainstream course of IC evolution, functional density (e.g., the number of interconnected devices per chip area) has generally increased while geometry size (e.g., the smallest component that can be created using a fabrication process) has decreased. However, this mainstream evolution needs to follow the Moore's rule by a huge investment in facility establishment. Therefore, it has been a study topic that using current semiconductor technology develops more valuable ICs product. CMOS MEMS happens to be a good candidate for that trend.

CMOS microelectromechanical systems (MEMS) devices are very small electro-mechanical systems incorporated into CMOS semiconductor IC circuits. One example of a MEMS device is a micro-inertial sensor. Traditional CMOS MEMS utilizes the back-end material like inter-metal-dielectrics (IMD) and metal layers as the inertial sensor material for spring and proof-mass. As a complex multi-layers design, the mechanical structure displays a unstable stress control and temperature instability. Further more, the MEMS structure utilizing the back-end material will occupy a part of CMOS circuit area that will increase the die size and cost. Besides the ICs and MEMS devices fabrication, traditional ICs dicing and packaging technology can't fully apply to MEMS as its floating mechanical structure (usually a proof mass with some supporting springs) will be damaged during the process. It is therefore another topic for CMOS MEMS to protect the device with a wafer-level scheme before it is sent to the post-end test and package process. Traditional packaging of MEMS devices use wire bonding and injection molding to protect a bonding area of the device. This type of packaging creates a relatively large overall size. For example, a common ratio for traditional device size before packaging and after packaging may be in a range of approximately 4-20 times the original device size, depending on the applied technology. Additionally, these devices are generally processed (e.g., to provide bonding wire connectors) one-by-one, which is time consuming and expensive.

However, today's mobile devices provide more and more functions, which in turn, requires more components, where the components need to be smaller and smaller. In addition, larger packaging requires more material to fabricate the packaging and therefore weighs more. All of this, adds to increased costs for the device in manufacturing, handling and shipping. Therefore, to solve above mentioned issues, what is needed is an innovative composite wafer semiconductor device, such as a MEMS device, and a method of fabrication.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
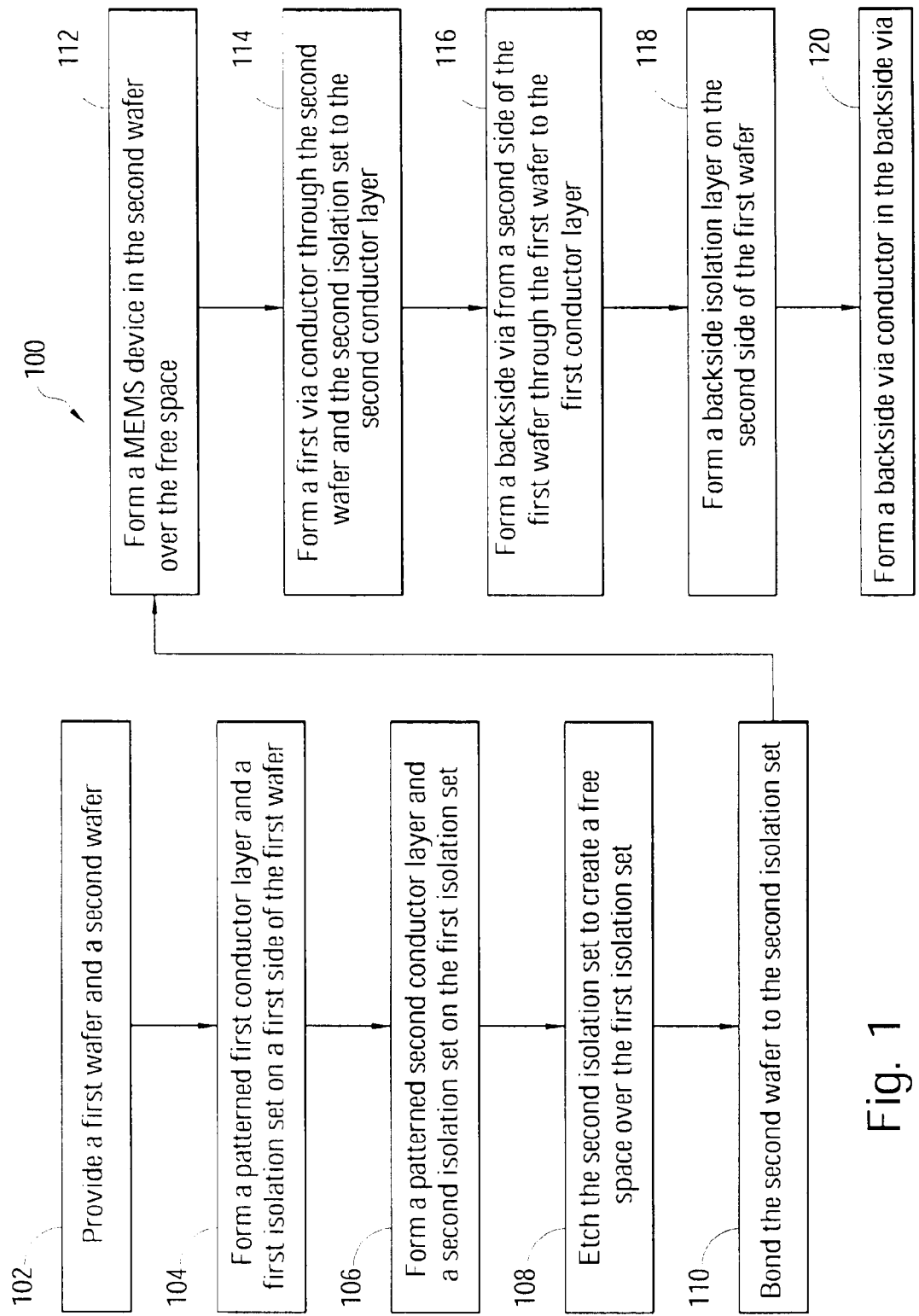
FIG. 1 is a flow chart illustrating an embodiment of a method of fabricating a semiconductor device having a composite wafer structure.

The present disclosure relates generally to semiconductor device and manufacturing. Specifically, the present disclosure relates to a composite wafer structure semiconductor device and method of fabricating. In an embodiment, the present disclosure provides a semiconductor micro-machined device, such as a micro-inertial sensor, with a wafer level processing scheme by bonding additional MEMS structural wafer and capping wafer on an ICs wafer and packaging using through silicon via technology. In one embodiment, the present disclosure provides a complementary metal oxide semiconductor (CMOS) chip scale packaging using through silicon via (TSV) for electrical connections for micro-machined devices having macro interfaces. Using the methods described herein the device's final size is reduced, thereby becoming more desirable for mobile devices and also thereby reducing device die, packaging and handling costs with respect to traditional devices.

It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer includes embodiments where the first and second layer are in direct contact and those where one or more layers are interposing the first and second layer. The present disclosure refers to MEMS devices; however, one of ordinary skill in the art will find other applicable technologies that may benefit from the disclosure such as, nanoelectromechanical systems (NEMS) devices, application specific integrated circuit (ASIC) devices, and other such devices. Furthermore, the MEMS device structure or design illustrated is exemplary only and not intended to be limiting in any manner.

FIG. 1 is a flow chart illustrating an embodiment of a method 100 for fabricating a semiconductor device having a composite wafer structure. Cross-sectional views of different embodiments of such composite wafer devices are shown in FIGS. 2-5 at a stage of fabrication. The present disclosure is described herein with respect to embodiments shown in FIGS. 2-5 relating to the method 100 provided in FIG. 1. The method 100 provides for a composite wafer semiconductor fabrication process. One of ordinary skill in the art would recognize additional steps that may be included in the method 100 and/or omitted from the method 100. The method 100 and the corresponding FIGS. 2, 3, 4 and 5 are exemplary only and not intended to be limiting. For example, the structure of the MEMS devices depicted in FIGS. 2, 3, 4 and 5 are exemplary only and similar methods may be used to form other devices. CMOS circuitry may be included in the device depicted in FIGS. 2, 3, 4 and 5.

Figure 2:
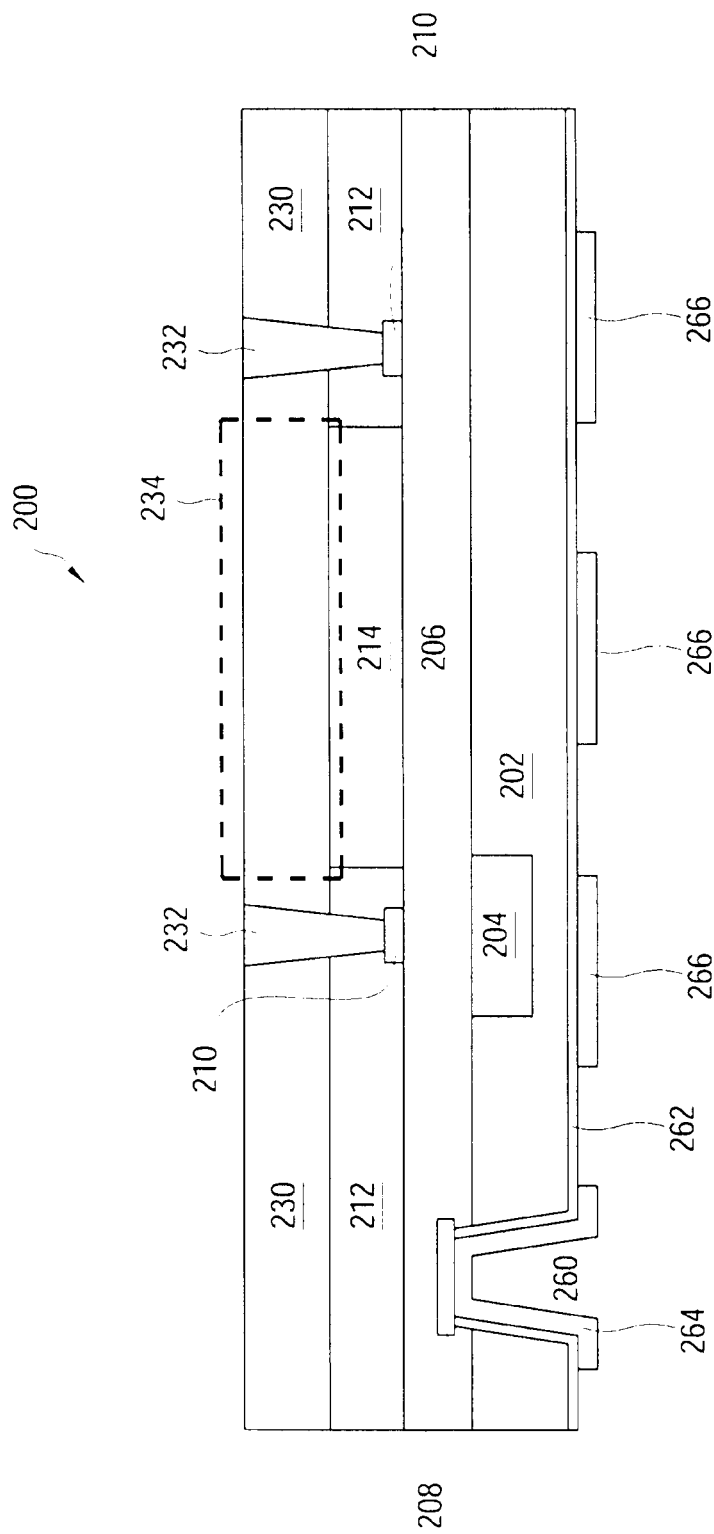
FIG. 2 is a cross-sectional view illustrating an embodiment of a composite wafer device according to the method of FIG. 1.

FIG. 2 is a cross-sectional view illustrating an embodiment of a semiconductor device 200 having a composite wafer structure according to the method 100 of FIG. 1. The method 100 begins at block 102 where a first wafer (e.g., a semiconductor substrate wafer 202) and a second wafer (e.g., wafer 230) are provided. In an embodiment, the wafer 202 is a silicon (Si) substrate. The wafer 202 may be crystalline Si or poly Si. In alternative embodiments, the wafer 202 may include other elementary semiconductors such as germanium, or may include a compound semiconductor such as, silicon carbide, gallium arsenide, indium arsenide, and indium phosphide. In an embodiment, the wafer 230 is a low-resistance semiconductor wafer. In an embodiment, the wafer 230 has a resistivity less than 1 ohm-cm. In an embodiment, the wafer 202 may include a silicon on insulator (SOI) substrate. One or more isolation features may be formed on the wafer 202. The wafer 202 may also include one or more integrated circuit devices 204, such as CMOS devices, (e.g., NMOS and/or PMOS transistors). The wafer 202 may include circuitry associated with the transistors such as interconnect layers (e.g., metal lines and vias), interlayer dielectric layers (ILD), and/or inter-metal dielectric layers (IMD).

The method 100 then proceeds to block 104 where a first dielectric isolation set 206 and a first patterned conductor layer 208, are formed on a first side (e.g., the upper side) of the first wafer 202. The method 100 then proceeds to block 106 where a second dielectric isolation set 212 and a second patterned conductor layer 210, are formed on a the first isolation set 206. The dielectric layers 206 and 212 (e.g., insulator layers) are formed on the wafer 202.

In an embodiment, the dielectric layers 206 and 212 include an oxide. There may be any number of dielectric layers formed on the wafer 202. However, it is not required that any layers of dielectric be applied to the wafer 202. The dielectric layers 206 and 212 may be silicon oxide layers formed at a thickness range of approximately 1 um to approximately 10 um. However, it is contemplated that other types and sizes of dielectric layers may be formed on the wafer 202. The dielectric layers 206 and 212 may be formed on the wafer 202 by integrated circuit (IC) processes (e.g., CMOS processes), such as bonding, depositing, growing and thermally oxidizing, chemical vapor deposition (CVD), or other methods known in the art for forming dielectric layers on a substrate 202.

Electrically conductive layers 208 and 210 are formed on the wafer 202 among the isolation set dielectric layers 206 and 212. The conductive layers 208 and 210 may be formed from a metal, such as tungsten, aluminum, copper, nickel or any other metal. However, any electrically conductive material may be used to form the conductive layers 208 and 210. It should be understood that the conductive layers 208 and 210 may be formed using patterning, masking, deposition (e.g., physical vapor deposition) and/or any other methods now known or known in the future for forming the conductive layers on the wafer 202. In an embodiment, the conductive layers 208 and 210 are patterned connection structures. In an embodiment, first conductor layer 208 and second conductor layer 210 are electrically coupled to one another. Also in an embodiment, one or more of the conductive layers 208, 210 electrically couple to the integrated circuit devices 204. As should be understood, the isolation sets 206 and 212 and the conductor layers 208 and 210 using conventional back-end IC processes for forming sequential interconnect layers and insulator layers.

The method 100 next proceeds to block 108 where a first free space 214 is etched in the second isolation set 212. The free space 214 is formed by performing a wet etching process or by forming a dry plasma etching process to the second isolation set 212. In an embodiment, the free space 214 extends through the second isolation set 212 to the first isolation set 206, however, this is optional. Size dimensions for the free space 214 may be any size to accommodate a floating structure 234 (e.g., a MEMS device) formed above the free space 214, as is described below.

The method 100 proceeds to block 110 where the second wafer 230 (e.g., a low-resistance doped silicon wafer) is bonded to the second isolation set 212. In an embodiment, the second wafer 230 is bonded to the second isolation set 212 using a low temperature bonding process. Because the first wafer 202 includes ICs 204, conductor layers 208/210, and isolation layers 206/212, the bonding temperature for bonding the second wafer 230 should not exceed approximately 500 C to avoid damaging components of the device 200. Accordingly, the present disclosure provides a low temperature bonding of first and second wafers (e.g., wafers 202 and 230) to create a first composite wafer structure semiconductor device. To accomplish the bonding, a set of cleaning processes may be performed on both the first wafer 202 structure (e.g., including the isolation sets 206 and/or 212) and the second wafer 230 before the bonding. In an embodiment, the cleaning processes may include one or more chemical-mechanical polishing (CMP) processes to planarize the surfaces to be bonded. Before bonding, the wafers are cleaned by a water scrub process and dipped in HF for removal of surface oxide layer. Then, a surface plasma treatment is applied to create a hydrophilic surface in nitrogen and/or oxygen plasma environment. The two wafers are then placed in contact with one another with a point force at the center point to generate an initial bond point. A bond force of larger than 1 kN and a post anneal temperature of larger 200 C can be applied to get a good bond strength. In an embodiment, the bond chamber has atmospheric pressure. However, in another embodiment, a vacuum chamber may be used as a bonding chamber. In an embodiment, the second wafer 230 covers and hermetically seals the free space 214, however, this is optional. After the bonding, the wafer 230 is further thinned to a pre-defined thickness of approximately 30 um. The thinning process may include grinding and CMP steps.

The method 100 proceeds to block 112 where a floating structure or membrane 234, such as a microelectromechanical system (MEMS) device, in whole or in part, is formed in the second wafer 230 over the free space 214. The MEMS device 234 may include a plurality of elements formed on metal, polysilicon, dielectric, and/or other materials. The MEMS device 234 may include materials typically used in a conventional CMOS fabrication process. Any configuration of MEMS device 234 may be possible, depending on the desired functionality. One or more of the elements depicted may be designed to provide MEMS mechanical structures of the MEMS device 234. The MEMS mechanical structures may include structures or elements operable for mechanical movement. The MEMS device 234 may be formed using typical processes used in CMOS fabrication, for example, photolithography, etching processes (e.g., wet etch, dry etch, plasma etch), deposition processes, plating processes, and/or other suitable processes. In an embodiment, the MEMS device 234 may be a motion sensor (e.g., a gyroscope, an accelerometer, etc.), a radio frequency (RF) MEMS device (e.g., an RF switch, filter, etc.), an oscillator, or any other MEMS type device. Various sizes of MEMS devices are contemplated. Because wafer 230 is bonded to the isolation set 212, the MEMS device 234 may be formed before and/or after the bonding.

In an embodiment, after the bonding process of block 110, the wafer 230 is thinned to a predefined thickness, such as approximately 1 um to approximately 100 um, based on desired application for the device. A portion of the floating structure 234 will interact with outside perturbation, such as temperature variation, inertial movement, pressure changes, and/or other electrical, magnetic, or optical parameter measurements. In an embodiment, when the device 200 is exposed to a pressure change, the floating structure/membrane 234 will deform inward or outward and thus, a sensing signal will be created to indicate a pressure change. It is noted that the portions of the second wafer 230 may also include one or more circuit devices (not shown), such as transistors (e.g., NMOS and/or PMOS transistors). The second wafer 230 may also include circuitry associated with the transistors, such as interconnect layers (e.g., metal lines and vias) and interlayer dielectric layers (ILD). As should be understood, embodiments of the present disclosure use vertical integration to form the MEMS device on the IC's device. As should be understood, this overcomes one or more drawbacks of conventional CMOS floating/MEMS-type devices known in the art that occupy a part of the IC's area.

The method 100 next proceeds to block 114 where a first via conductor 232 is formed through the second (conductive) wafer 230 and the second isolation set 212, to a point on the second conductor layer 210. In forming the via conductor 232, one or more channels are formed to extend through wafer 230 and the isolation set 230 to the conductive layer 210. Any method for forming channels (e.g., masking and etching) may be used to form the channels. After the channels are formed, electrically conductive plugs are formed in the channels. There can be any number of plugs. In an embodiment, the plugs are formed from a conductive metal, such as, tungsten, aluminum, copper, nickel or other conductive metals. However, any electrically conductive substance may be used to form the plugs. The plugs may be formed using patterning, masking, deposition (e.g., physical vapor deposition (PVD), chemical vapor deposition (CVD)) and/or any other methods now known or known in the future for forming the plugs.

Accordingly, in an embodiment, the floating structure 234 is electrically connected to the second conductor layer 210 by the first via conductor 232, which may be located at a conventional bonding area. The first via conductor 232 is formed in a through via hole that penetrates both the second wafer 230 and the second isolation set 212. Thus, the present disclosure provides an interconnect between the floating structure 234 and the first wafer structure 202 and related layers formed thereon. To save device size, the via hole may be sized as small as practically possible. In an embodiment, the aspect ratio of this via hole is larger than 5. In an embodiment, the via conductor 232 may be a stacking structure including different material layers to achieve a good, low contact resistance with both the second wafer 230 and with the second conductor layer 210. Such material layers may include Ti, TiN, Al, W, or other similar materials. Using the via conductor 232, the floating structure 234 may also be electrically connected to the IC devices 204 and the perturbation can be transferred to a measurable electrical signal via processing of the IC devices 204.

The method 100 then proceeds to block 116 where a backside via is formed from a second side (e.g., the lower/backside) of the first wafer 202, through the first wafer 202, to the first conductor layer 208. In forming the backside via 260, a channel is formed to extend through wafer 202 and a portion of the isolation set 206 to a back side of the conductive layer 208. Any method for forming channel (e.g., masking and etching) may be used to form the channel. As should be understood, embodiments of the present disclosure overcome one or more drawbacks of conventional floating/MEMS-type devices, namely having a large overall size and having to be internally connected using a bonding wire and bonding pads using a secondary operation. In other words, using a conductor in the backside via 260 allows for connecting the floating device 234 to the second side (back side) of the first wafer 202, through the device 200, without using a bonding wire, as is used in conventional devices. In an embodiment, the backside vias for the device 200 may be formed using deep silicon etching, which may be known as the "Bosch Process" to those skilled in the art.

The method 100 proceeds to block 118 where a backside isolation layer 262 is formed on the second side of the first wafer 202. The backside isolation layer 262 includes any number of isolation layers formed on the second side of the wafer 202 and into the backside via 260, but not completely covering the backside of the first conductive layer 208 exposed by the backside via 260 (See FIG. 2). However, it is not required that any layers of dielectric be applied to the second side of the first wafer 202. The backside isolation layer 262 may be polymer or silicon oxide layers. However, it is contemplated that other types and different thicknesses of dielectric layers may be formed on the second side of the wafer 202. The backside isolation layers 262 may be formed on the second side of the wafer 202 by integrated circuit (IC) processes (e.g., CMOS processes), such as spin or spray coating, depositing, growing and thermally oxidizing, chemical vapor deposition (CVD), or other methods known in the art for forming dielectric layers on a substrate such as the first wafer 202.

The method 100 proceeds next to block 120 where a backside via conductor 264 is formed in the backside via 260, electrically connecting the backside of the first conductive layer 208 to the backside of the first wafer 202. In an embodiment, any number of exposed backside conductor pads 266 are formed on the second side of the first wafer 202. In an embodiment, the backside via conductor 264 and the conductor pads 266 are formed from a conductive metal, such as, tungsten, aluminum, copper, nickel or other conductive metals. However, any electrically conductive substance may be used to form the conductor 264 and/or the conductor pads 266. The conductor 264 and the conductor pads 266 may be formed using patterning, masking, deposition (e.g., physical vapor deposition (PVD), chemical vapor deposition (CVD)) and/or any other methods now known or known in the future for forming conductors. As should be understood, the backside conductor 264 is disposed in the backside via 260 and connected to the first conductor layer 208 and a plurality of re-distributed exposed conductor pads 266 corresponding to the backside via conductor 264 may be formed on the second surface of the first wafer 202. In an embodiment, the exposed backside conductor pads 266 are formed in the same process as the backside via conductor 264.

As should be understood, the backside via conductor 264 and the exposed conductor pads 266 may be mounted directly onto a printed circuit board (PCB) using surface-mount technology processes, making embodiments provided herein much different than conventional MEMS-type devices, at least because they use no wire bonding technologies and no extra holding substrate layers to support the device (e.g., 200). In other words, the first wafer 202 is itself the holding substrate for the device 200. Using through wafer vias (e.g., 260) and conductor pads (e.g., 266), embodiments of the present disclosure can be formed much smaller than traditional devices, thereby using much less raw materials for forming the device 200.

It is noted that the process flow described in FIG. 1 may change to accommodate the requirements for process control of the fabrication process. For example, the steps 112-114 may come after the steps 116-120.

Figure 3:
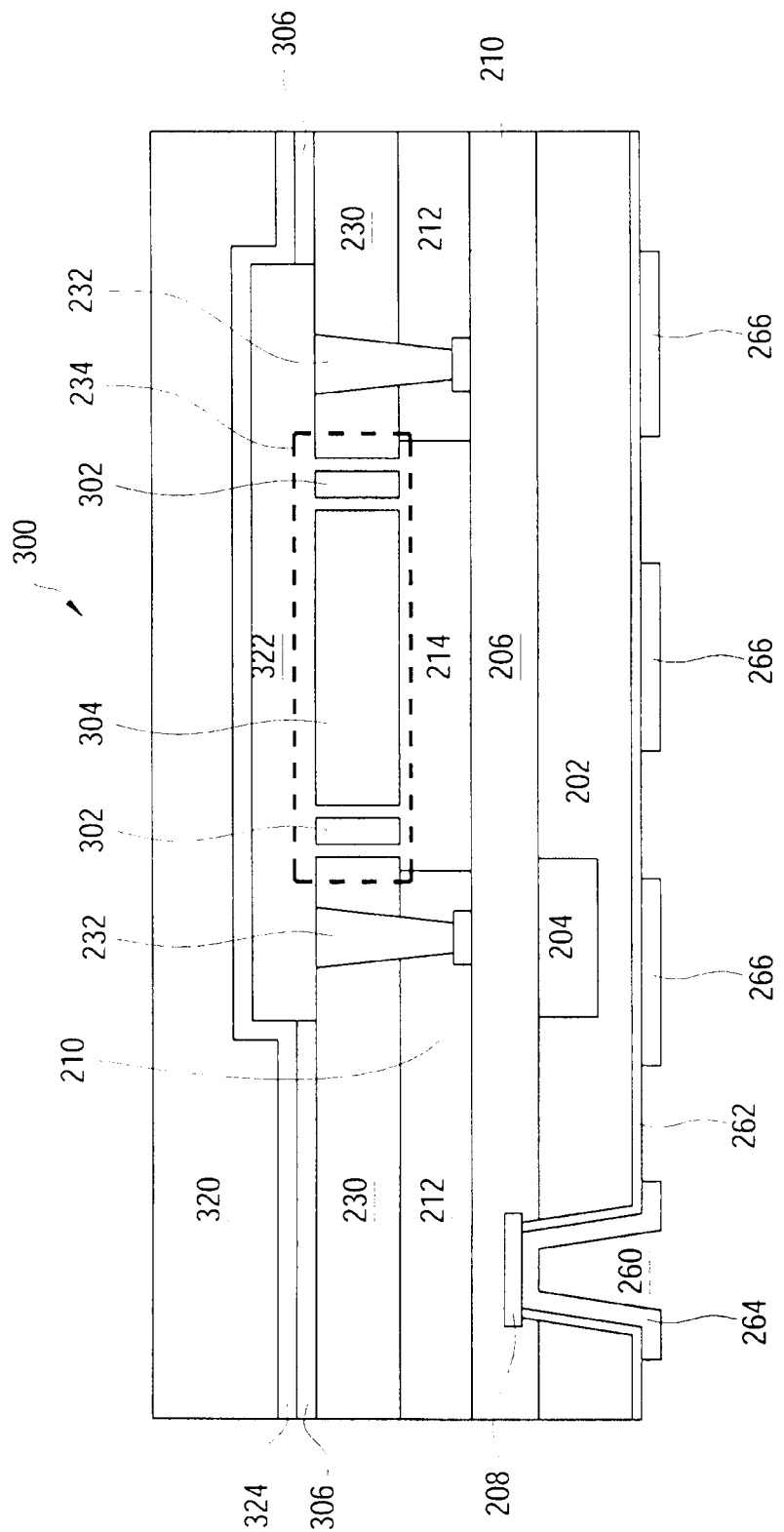
FIG. 3 is a cross-sectional view illustrating an embodiment of another composite wafer device according to the method of FIG. 1.
Figure 4:
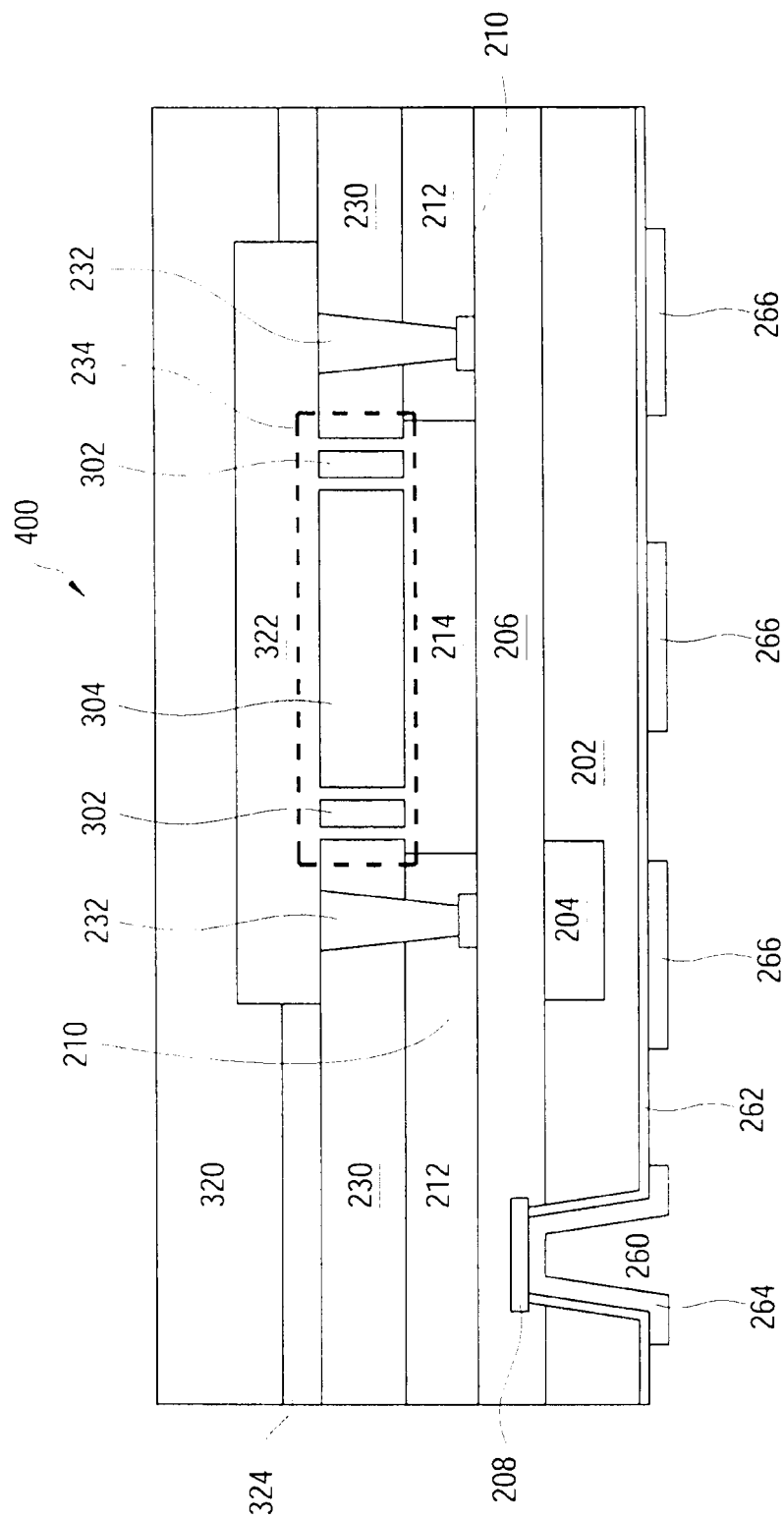
FIG. 4 is a cross-sectional view illustrating an embodiment of still another composite wafer device according to the method of FIG. 1.
Figure 5:
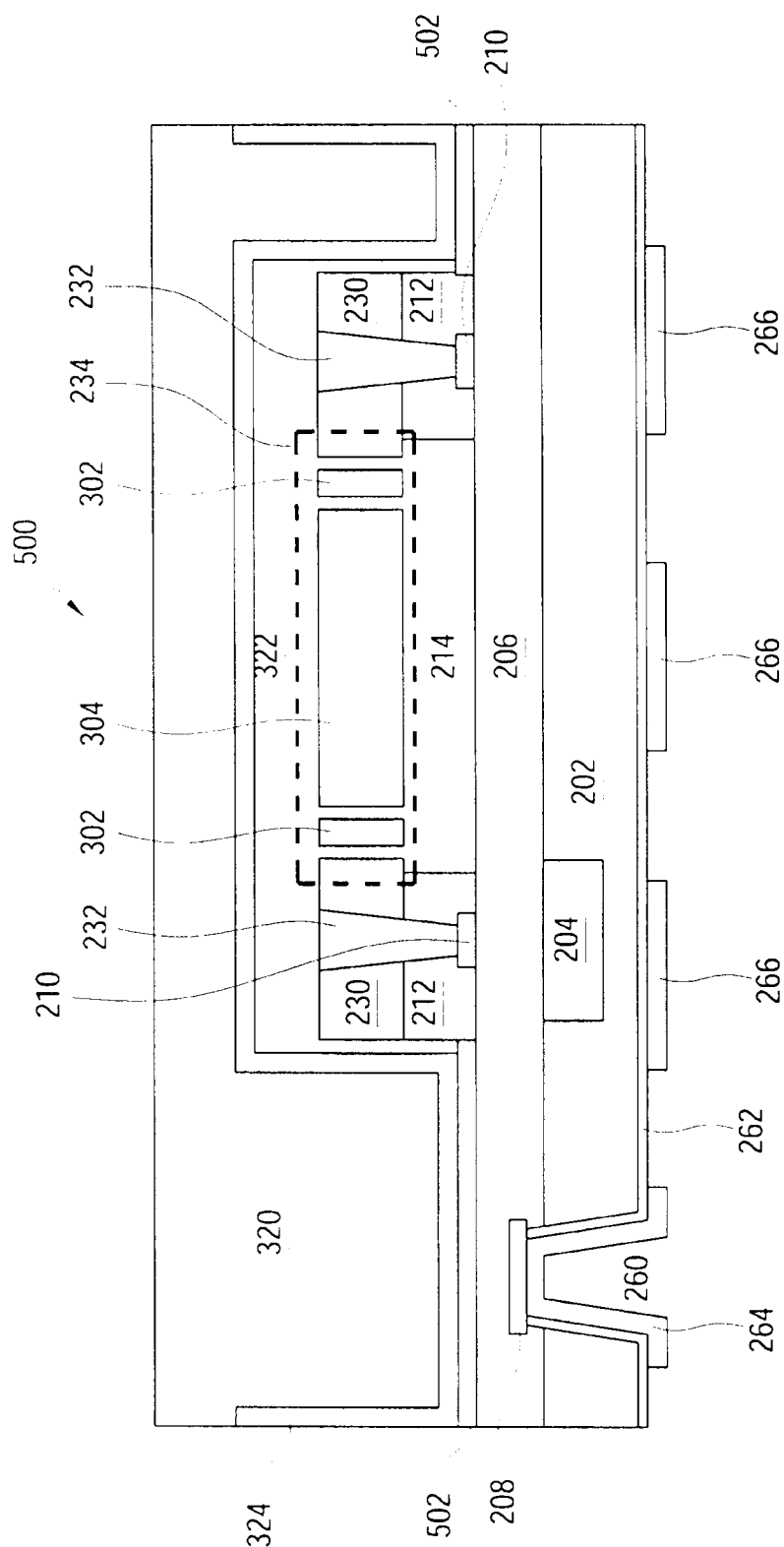
FIG. 5 is a cross-sectional view illustrating an embodiment of yet another composite wafer device according to the method of FIG. 1.

FIG. 3 is a cross-sectional view illustrating an embodiment of another composite wafer device 300 according to the method 100 of FIG. 1. FIG. 4 is a cross-sectional view illustrating an embodiment of still another composite wafer device 400 according to the method 100 of FIG. 1. And FIG. 5 is a cross-sectional view illustrating an embodiment of yet another composite wafer device 500 according to the method 100 of FIG. 1. The devices 300, 400, and 500 are formed substantially similarly to the device 200 discussed above and one another. Reference numerals are repeated in devices 300, 400, and 500 for elements that may be substantially the same as that described above for device 200 and also in the other devices 300, 400, and 500 described below. This repetition is for the purpose of simplicity and clarity and does not in itself dictate a relationship between the various embodiments and/or configurations discussed. Accordingly, the repeated elements will not be re-described, but rather, differences of devices are described below.

FIG. 3 is a cross-sectional view illustrating an embodiment of another composite wafer device 300 according to the method 100 of FIG. 1. In this embodiment, the floating micro device structure 234 is formed (e.g., by masking and etching) to have one or more support springs 302 supporting a proof mass 304 portion of the floating structure 234. As should be understood, the support springs 302 may be attached to a portion of the second wafer 230 and the proof mass 304 three-dimensionally, into or out of the device 300, which cannot be seen in the cross-sectional view of FIG. 3. The support springs 302 allow the second wafer 230 to flex so that the proof mass 304 is able to be displaced without breaking the second wafer 230.

Also in this embodiment, a first bonding layer 306 is formed on a surface of the second wafer 230. Additionally, a third wafer 320 is provided. Corresponding to the floating structure 234, a portion of the third wafer 320 is etched to a depth to define a depression therein. A second bonding layer 324 is formed on a surface of the third wafer 320. Thereafter, the third wafer 320 is bonded or otherwise disposed on the second wafer 230 via the bonding layers 306 and 324. The bonding layers 306 and 324 may be metal-to-metal or metal-to-semiconductor. The bonding layers may comprise Si to Al, Si to Au, Ge to Al, Ti to Al, or any variety of adequate bonding layers. For example, Al to Ge eutectic bonding is an option for providing low temperature bonding. In an embodiment, an Al—Ge eutectic bonding temperature may be approximately 424 C at a Ge atomic % of approximately 30%. As should be understood, eutectic wafer bonding does not require application of a high contact force. Due to the liquid phase formed during the process, high contact force results in metal squeezing out of the interface, thereby resulting in a poor interface layer uniformity, as well as contamination of the bond tools and bond chamber. Therefore, a role of the low contact force required for the bonding is to ensure a good contact of the two wafers and good contact of the two heaters of the bonder with wafers' back sides. Thus, eutectic wafer bonding is a good bonding process for high-vacuum applications, such as this, as this process has a very low specific outgasing of gasses due to the use of only high purity components. The liquid melt formed during the process enhances the high vacuum compatibility by allowing high a quality bond seal, even on non-perfect bonding surfaces.

The third wafer 320 protects the floating structure 234 from environmental interference and/or damage, such as if the floating structure 234 is formed as an accelerometer or a gyro sensor. By bonding the third wafer 320 to the second wafer 230, the defined depression in the third wafer 320 is aligned above the floating structure 234 to form a second free space 322. As such, the floating structure 234 is free to move back and forth between the first free space 214 and the second free space 322.

FIG. 4 is a cross-sectional view illustrating an embodiment of still another composite wafer device 400 according to the method 100 of FIG. 1. The device 400 is substantially similar to the device 300. However, the device 400 has the third wafer 320 bonded to the second wafer 230 using a single layer bonding material, namely bonding layer 324. In an embodiment, the bonding layer 324 comprises a polymer, a metal, a silicon oxide, or other suitable bonding material.

FIG. 5 is a cross-sectional view illustrating an embodiment of yet another composite wafer device 500 according to the method 100 of FIG. 1. The device 500 is substantially similar to the device 300. However, the device 500 has a portion of the second wafer 230 and a corresponding portion of the second isolation set 212 etched away or otherwise formed such that the third wafer 320 bonds to the first wafer 100 structure via the first isolation set 206 and bonding layers 324 and 502. In an embodiment, the bonding layer 502 is substantially similar to the bonding layer 306.

The present disclosure provides for many different embodiments of the present disclosure. In one embodiment, the present disclosure describes a composite wafer semiconductor device and method of fabricating. In an embodiment, the composite wafer semiconductor device includes a first wafer and a second wafer. The first wafer has a first side and a second side, and the second side is substantially opposite the first side. The composite wafer semiconductor device also includes an isolation set is formed on the first side of the first wafer and a free space is etched in the isolation set. The second wafer is bonded to the isolation set. A floating structure, such as an inertia sensing device, is formed in the second wafer over the free space. In an embodiment, a surface mount pad is formed on the second side of the first wafer. Then, the floating structure is electrically coupled to the surface mount pad using a through silicon via (TSV) conductor.

In another embodiment, the present disclosure provides a method of forming a composite wafer semiconductor. In an embodiment, this method includes providing a first wafer and a second wafer. The method includes forming a patterned first conductor layer and a first isolation set on a first side of the first wafer, forming a patterned second conductor layer and a second isolation set on the first isolation set, and etching the second isolation set to create a free space in the second isolation set over a portion of the first isolation set. Next, the method includes bonding the second wafer to the second isolation set and forming a microelectromechanical system (MEMS) device in the second wafer over the free space. Additionally, the method includes forming a first via conductor through the second wafer and through a portion of the second isolation set to the second conductor layer, forming a backside via from a second side of the first wafer to the first conductor layer, forming a backside isolation layer on the second side of the first wafer, and forming a backside via conductor in the backside via.

In yet another embodiment, the present disclosure provides a composite wafer semiconductor device. This composite wafer semiconductor device includes a first wafer having a patterned first conductor layer and a first isolation set formed on a first side of the first wafer. The composite wafer semiconductor device also includes a patterned second conductor layer and a second isolation set formed on the first isolation set. A free space is etched in the second isolation set over a portion of the first isolation set. The device further includes a second wafer bonded to the second isolation set, and a microelectromechanical system (MEMS) device formed in the second wafer over the free space. A first via conductor is formed through the second wafer and through a portion of the second isolation set to the second conductor layer and a backside via is formed from a second side of the first wafer to the first conductor layer. A backside isolation layer is formed on the second side of the first wafer and a backside via conductor is formed in the backside via.

As should be understood, that an embodiment of the present disclosure provides a semiconductor device and method of fabrication for a composite wafer structure, which is formed by combining wafer bonding and using through silicon vias (TSVs) to define small and cost-effective chip-scale packaging. Two or more wafers are bonded with one portion of one wafer forming a micro-device and the other wafer forming a supporting carrier. TSVs are formed in the carrier wafer to deliver electrical connection to form a macro-interface for communicating outside of the device.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:
1. A device comprising:
a first substrate;
a patterned first conductor layer and a first isolation set formed on a first side of the first substrate;
a patterned second conductor layer and a second isolation set formed on the first isolation set;
a free space etched in the second isolation set over a portion of the first isolation set;
a second substrate bonded to the second isolation set;
a microelectromechanical system (MEMS) device formed in the second substrate over the free space;
a first via conductor formed through the second substrate and through a portion of the second isolation set to the second conductor layer, wherein the first via conductor electrically couples the MEMS device to the second conductor layer;
a backside via formed from a second side of the first substrate to the first conductor layer;
a backside isolation layer formed on the second side of the first substrate;
a backside via conductor formed in the backside via; and
a third substrate disposed over the second substrate, wherein the third substrate is bonded to the second substrate by a first eutectic bonding material and a second eutectic bonding material.

2. The device of claim 1, wherein the first substrate comprises a semiconductive material, and wherein the second substrate comprises a conductive material.

3. The device of claim 1, wherein the second substrate is bonded to the second isolation set below approximately 500 C.

4. The device of claim 1, further comprising:
an integrated circuit (IC) formed in the first substrate.

5. The device of claim 1, wherein a portion of the second conductor layer electrically couples to a portion of the first conductor layer.

6. The device of claim 1, wherein a portion of the backside via conductor is configured as a surface mount technology (SMT) pad.

7. The device of claim 1, wherein the third substrate has a cavity formed therein that is directly over the MEMS device, and wherein the second eutectic bonding material is disposed along the third substrate within the cavity and extends directly over the MEMS device.

8. A device comprising:
a first substrate having a first surface opposing a second surface;
a first dielectric layer and a first conductive layer formed over the first surface of the first substrate;
a second dielectric layer and a second conductive layer formed over the first dielectric layer and the first conductive layer of the first substrate;
a space within the second dielectric layer;
a second substrate bonded to the second dielectric layer of the first substrate;
a floating structure formed in the second substrate over the space;
a first via extending through the second substrate and the second dielectric layer to the second conductive layer, wherein the first via electrically couples the floating structure to the second conductive layer; and
a third substrate disposed on the second substrate, wherein the third substrate is bonded to the second substrate by a eutectic system.

9. The device of claim 8, wherein the floating structure includes a microelectromechanical system (MEMS) device in the second substrate over the space.

10. The device of claim 8, wherein a portion of the first dielectric layer is exposed by the space within the second dielectric layer.

11. The device of claim 8, further comprising a second via extending through the second substrate and through a portion of the second dielectric layer.

12. The device of claim 11, wherein the second via extends to the second conductive layer.

13. The device of claim 8, wherein the first conductive layer is embedded within the first dielectric layer.

14. The device of claim 8, further comprising a bonding layer formed between the first substrate and the second substrate to facilitate bonding of the first and second substrates.

15. The device of claim 8, wherein the third substrate includes a recess formed therein directly over the floating structure, and wherein a material of the eutectic system is disposed within the recess.

16. A device comprising:
- a first substrate having a first side and an opposing second side;
- an isolation set on the first side of the first substrate;
- a first free space disposed in the isolation set;
- a second substrate coupled to the first substrate;
- a floating structure disposed in the second substrate over the free space;
- a first via conductor extending through the first substrate to electrically couple the floating structure to a pad on the second side of the first substrate;
- a second via conductor extending through the second substrate and through a portion of the isolation set to electrically couple the floating structure to the second via conductor; and
- a third substrate eutectically bonded to the second substrate, wherein the third substrate includes a second free space disposed therein, and wherein the second free space is disposed directly over the floating structure.

17. The device of claim 16, wherein the floating structure includes a microelectromechanical system (MEMS) device.

18. The device of claim 16, wherein the second substrate being coupled to the first substrate includes the second substrate physically contacting the isolation set.

19. The device of claim 16, further comprising another isolation set on the first side of the first substrate and a conductive layer embedded within the another isolation set.

20. The device of claim 19, wherein the first via conductor extends through the another isolation set on the first side of the first substrate to the conductive layer embedded within the another isolation set.

* * * * *